United States Patent
Cheng

(10) Patent No.: US 12,538,539 B2
(45) Date of Patent: Jan. 27, 2026

(54) ENHANCEMENT-MODE SEMICONDUCTOR DEVICE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 593 days.

(21) Appl. No.: 17/554,186

(22) Filed: Dec. 17, 2021

(65) Prior Publication Data
US 2022/0199781 A1 Jun. 23, 2022

(30) Foreign Application Priority Data
Dec. 17, 2020 (CN) .......................... 202023044690.0

(51) Int. Cl.
*H10D 62/85* (2025.01)
*H10D 30/47* (2025.01)
*H10D 62/17* (2025.01)
*H10D 62/824* (2025.01)

(52) U.S. Cl.
CPC ....... *H10D 62/8503* (2025.01); *H10D 30/475* (2025.01); *H10D 62/343* (2025.01); *H10D 62/824* (2025.01)

(58) Field of Classification Search
CPC ............. H01L 29/2003; H01L 29/205; H01L 29/1066; H01L 29/7786; H01L 29/66431; H01L 29/66462; H01L 29/778–7789; H01L 2924/13064; H01L 29/122–127;
(Continued)

(56) References Cited

U.S. PATENT DOCUMENTS

| 12,100,759 B2 * | 9/2024 | Li | H10D 30/4755 |
| 2005/0258451 A1 * | 11/2005 | Saxler | H10D 30/4755 |
| | | | 257/E21.406 |

(Continued)

FOREIGN PATENT DOCUMENTS

CN 212062440 U * 12/2020 ....... H01L 21/26546

OTHER PUBLICATIONS

Tallarico Threshold Voltage Instability in GaN HEMTs With p-Type Gate: Mg Doping Compensation, 2019 (Year: 2019).*

*Primary Examiner* — Britt Hanley
*Assistant Examiner* — Casey Paul Boatman
(74) *Attorney, Agent, or Firm* — Westbridge IP LLC

(57) ABSTRACT

Disclosed is an enhancement-mode semiconductor device, comprising: a substrate; a p-type nitride semiconductor layer and an n-type nitride semiconductor layer formed on the substrate in sequence, the p-type nitride semiconductor layer having a first protruding structure at a gate region of the p-type nitride semiconductor layer; the n-type nitride semiconductor layer having a first through hole corresponding to the first protruding structure, exposing the gate region of the p-type nitride semiconductor layer; a channel layer conformally disposed on the n-type semiconductor layer and the first protruding structure; a barrier layer, the barrier layer being conformally disposed on the channel layer. The enhancement-mode semiconductor device has a simple structure, a good repeatability, and avoids impurities and defects brought to the channel layer and the barrier layer.

16 Claims, 3 Drawing Sheets

(58) Field of Classification Search
CPC .......... H01L 29/15–158; H10D 30/475; H10D 62/8503; H10D 62/343; H10D 62/824
See application file for complete search history.

(56) References Cited

U.S. PATENT DOCUMENTS

| | | | |
|---|---|---|---|
| 2009/0057718 A1* | 3/2009 | Suvorov | H01L 29/452 |
| | | | 257/E21.399 |
| 2010/0044753 A1* | 2/2010 | Sugimoto | H01L 29/7788 |
| | | | 257/E29.091 |
| 2015/0221815 A1* | 8/2015 | Clatterbuck | H10H 20/00 |
| | | | 362/293 |
| 2016/0300941 A1* | 10/2016 | Cheng | H10D 64/513 |
| 2017/0077279 A1* | 3/2017 | Onizawa | H01L 29/7786 |
| 2019/0311914 A1* | 10/2019 | Cheng | H01L 29/7786 |
| 2021/0226010 A1* | 7/2021 | Lee | H01L 29/778 |
| 2022/0254911 A1* | 8/2022 | Li | H01L 21/266 |

* cited by examiner

ENHANCEMENT-MODE SEMICONDUCTOR DEVICE

CROSS-REFERENCE TO RELATED APPLICATIONS

This application claims priority to Chinese Patent Application No. 202023044690.0, filed on Dec. 17, 2020, which is hereby incorporated by reference in its entirety.

TECHNICAL FIELD

This application relates to the field of semiconductors, and in particular to a semiconductor structure.

BACKGROUND

Wide bandgap semiconductor materials represented by GaN have relatively high saturation electron velocities and wide band gaps.

Enhancement-mode devices of GaN-based materials have a wide range of applications in high-voltage switches and high-speed radio frequency circuits. In the prior art, in order to realize an enhancement-mode device, the commonly used technical solutions include: reducing the thickness of the barrier layer; etching a part of the barrier layer under the gate; implanting fluorine ions in the region of the barrier layer under the gate; disposing p-type semiconductors on the barrier layer under the gate, etc. However, these methods have shortcomings. Thinning the barrier layer will reduce the concentration of two-dimensional electron gas in the entire channel region, resulting in a small saturation current of the device. It is difficult to control the etching depth when etching the part of the barrier layer under the gate, and the etching damage leads to a large gate leakage current. It is difficult to achieve high threshold voltage by implanting fluoride ions in the region under the gate, and the stability of fluoride ions is not good, which has an impact on the reliability of the device under high-voltage and high-temperature. Setting p-type semiconductors under the gate requires to etch the p-type semiconductors except the gate region, it is very difficult to achieve precise control of the etching thickness so as not to cause losses to the barrier layer, and the defects caused by the etching and the magnesium atoms remaining in p-type aluminum gallium nitride can cause severe current collapse effects.

SUMMARY

In view of this, the purpose of this application is to provide an enhancement-mode semiconductor device to solve the problem of unstable device performance caused by disposing a p-type semiconductor under the gate.

In order to achieve the above purpose, this application provides an enhancement-mode semiconductor device, comprising:
 a substrate;
 a p-type nitride semiconductor layer located on the substrate, the p-type nitride semiconductor layer having a first protruding structure at a gate region of the p-type nitride semiconductor layer;
 an n-type nitride semiconductor layer, the n-type nitride semiconductor layer being located on the p-type nitride semiconductor layer, and the n-type nitride semiconductor layer having a first through hole corresponding to the first protruding structure;
 a channel layer, the channel layer being conformally disposed on the n-type semiconductor layer and the first protruding structure; and
 a barrier layer, the barrier layer being conformally disposed on the channel layer.

As an optional technical solution, the enhancement-mode semiconductor device further includes: a source located in a source region of the barrier layer, a gate located in the gate region of the barrier layer, and a drain located in a drain region of the barrier layer.

As an optional technical solution, an upper surface of the n-type nitride semiconductor layer and an upper surface of the first protruding structure are flush.

As an optional technical solution, the enhancement-mode semiconductor device further includes: the p-type nitride semiconductor layer, the n-type nitride semiconductor layer, the channel layer and the barrier layer are made of GaN-based materials.

As an optional technical solution, the enhancement-mode semiconductor device further includes an unintentionally doped nitride layer, wherein the unintentionally doped nitride layer is located on the p-type semiconductor layer, the first through hole penetrates the n-type nitride semiconductor layer so that a gate region of the unintentionally doped nitride layer is exposed.

As an optional technical solution, a thickness of the n-type nitride semiconductor layer is 12-20 nm.

As an optional technical solution, a thickness of the unintentionally doped nitride layer is 15-20 nm.

As an optional technical solution, a second protruding structure is disposed on the substrate and in the gate region, and the p-type nitride semiconductor layer is conformally disposed on the substrate, the first protruding structure corresponds to a second protruding structure.

In the enhancement-mode semiconductor device disclosed in this application, the p-type nitride semiconductor layer is activated in the gate region, which can deplete the two-dimensional electron gas at the gate region of the channel layer and the barrier layer, thereby realizing the enhancement-mode device.

In the enhancement-mode semiconductor device disclosed in this application, impurities and defects brought to the barrier layer are avoided by disposing the p-type nitride semiconductor layer under the channel layer, so that a more stable and uniform threshold voltage can be obtained, and there is no need to worry about the problem that the etching depth needs to be precisely controlled to avoid etching loss to the barrier layer when etching the groove.

In the enhancement-mode semiconductor device disclosed in this application, the disposition of the n-type semiconductor layer can play a good role in protecting the subsequent channel layer. The p-type impurity elements doped in the p-type semiconductor layer will diffuse into the subsequently prepared semiconductor layers. Disposing the n-type semiconductor layer can play a good buffering role to prevent p-type impurity elements in the p-type semiconductor layer from entering the channel layer and affecting the concentration of the two-dimensional electron gas in the channel layer and the working performance of the device. In addition, through the design of the highly doped p-type nitride semiconductor layer and the unintentionally doped nitride layer, the diffusion of p-type impurity elements into the channel layer can be well avoided.

In the enhancement-mode semiconductor device disclosed in this application, the first protruding structure is obtained by disposing the second protruding structure on the substrate, and gradually conducting it to the p-type nitride semiconductor layer. The n-type nitride semiconductor layer on the first protruding structure in the gate region is removed by a planarization process to avoid etching damage to the p-type nitride semiconductor layer caused by the etching process, thereby avoiding affecting the performance of the channel layer.

In order to make the above-mentioned and other objects, features and advantages of this application more obvious and easier to understand, the preferred embodiments are hereinafter described in detail together with the accompanying drawings.

BRIEF DESCRIPTION OF DRAWINGS

In order to more clearly illustrate the embodiments of this application or the technical solutions in the prior art, the accompanying drawings required in the embodiments will be briefly introduced below. Obviously, the drawings in the following description are only some embodiments of this application. In the embodiments, for those of ordinary skill in the art, other drawings can also be obtained according to these drawings without any creative effort. The above and other objects, features and advantages of this application will be more apparent from the accompanying drawings. The same reference numerals refer to the same parts throughout the drawings. The drawings are not intentionally scaled to actual size, and the emphasis is on illustrating the subject matter of this application.

DETAILED DESCRIPTION OF THE EMBODIMENTS

Figure 1:
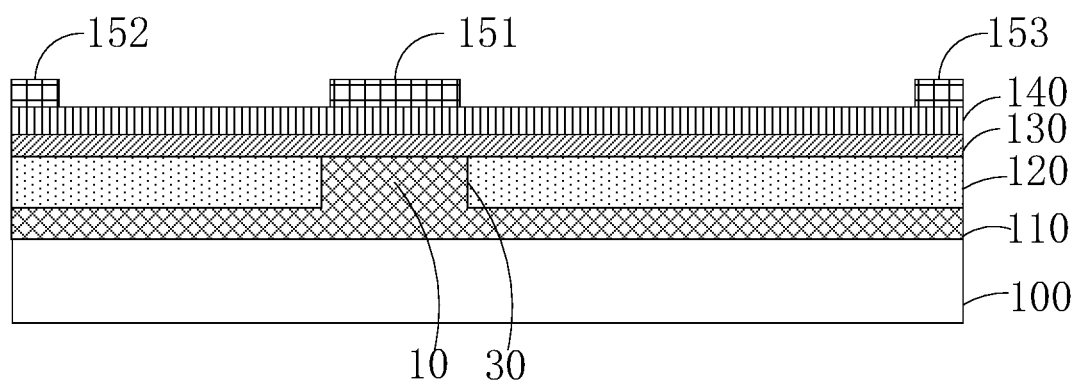
FIG. 1 is a schematic structural diagram of an enhancement-mode semiconductor device according to a first embodiment of this application.

The technical solutions in the embodiments of this application will be clearly and completely described below with reference to the drawings in the embodiments of this application. Apparently, the described embodiments are only a part of the embodiments of this application, rather than all the embodiments. Based on the embodiments in this application, all other embodiments obtained by those of ordinary skill in the art without creative efforts shall fall within the protection scope of this application.

It should be noted that like numerals and letters refer to like items in the following figures, so once an item is defined in one figure, it does not require further definition and explanation in subsequent figures. Meanwhile, in the description of this application, the terms "first", "second", etc. are only used to distinguish the description, and cannot be understood as indicating or implying relative importance. In the description of the embodiments of this application, it will be understood that when a layer (or film), region, pattern or structure is referred to as being "on" or "under" another substrate, another layer (or film), another region, another pad or another pattern, it may be "directly" or "indirectly" on another substrate, layer (or film), region, pad or pattern, or there may also be one or more intermediate layers. Such a position of the layers has been described with reference to the drawings. The thickness and size of each layer shown in the drawings may be exaggerated, omitted or schematically drawn for the purpose of convenience or clarity. In addition, the dimensions of the elements do not fully reflect the actual sizes.

FIG. 1 is a schematic structural diagram of an enhancement-mode semiconductor device according to a first embodiment of this application. As shown in FIG. 1, the enhancement-mode semiconductor device according to the first embodiment of this application includes: a substrate 100, a p-type nitride semiconductor layer 110, an n-type nitride semiconductor layer 120, a channel layer 130, a barrier layer 140, a source 151, a gate 152, and a drain 153. The p-type nitride semiconductor layer 110 is located on the substrate 100, and the p-type nitride semiconductor layer 110 has a first protruding structure 10 at a gate region of the p-type nitride semiconductor layer 110. The n-type nitride semiconductor layer 120 is located on the p-type nitride semiconductor layer 110, and the n-type nitride semiconductor layer 120 has a first through hole 30 corresponding to the first protruding structure 10. The channel layer 130 is conformally disposed on the n-type semiconductor layer 120 and the first protruding structure 10. The barrier layer 140 is conformally disposed on the channel layer 130.

The p-type nitride semiconductor layer 110 contains p-type impurity elements, and the p-type impurity elements are in a passivation state. The substrate 100 includes Si, sapphire, SiC, gallium nitride, etc. The material of the substrate 100 is not particularly limited in this application. The p-type semiconductor layer 110 is made of a GaN-based material, and the GaN-based material described in this application is a material containing at least Ga and N atoms. The p-type impurity elements include Mg.

Hydrogen gas is used in the preparation process of the p-type nitride semiconductor layer 110, and the H atoms form Mg-H bonds with Mg, so that the p-type impurity elements are in the passivation state, so that the p-type nitride semiconductor layer 110 cannot effectively form holes, and the Mg needs to be activated by an activation process to make H atoms overflow.

The first protruding structure 10 of the p-type nitride semiconductor layer 110 in the gate region is obtained by etching and removing a part of the p-type nitride semiconductor layer 110 on a region other than the gate region.

The n-type nitride semiconductor layer 120 located on the p-type nitride semiconductor layer 110 contains n-type impurity elements including Si. The n-type nitride semiconductor layer 120 is made of the GaN-based material. A thickness of the n-type nitride semiconductor layer may be, for example, 8-20 nm, preferably 12-20 nm.

The first through hole 30 of the n-type nitride semiconductor layer 120 exposes the first protruding structure 10. Preferably, an upper surface of the n-type nitride semiconductor layer 120 is flush with an upper surface of the first protruding structure 10. For example, a chemical mechanical planarization method can be used to reduce the thickness and obtain a flat surface by polishing and smoothing the surface.

The first through hole 30 of the n-type nitride semiconductor layer 120 exposes the first protruding structure 10 so that the gate region of the p-type semiconductor layer 110 is exposed. It should be understood that the gate region defined in this application is the region of each semiconductor layer that is corresponding to the gate, which may be determined according to the designed gate position. The n-type doped n-type nitride semiconductor layer 120 can prevent the overflow of H atoms, so only the H atoms of the p-type nitride semiconductor layer 110 in the gate region that is not covered by the n-type nitride semiconductor layer 120 can overflow, that is, only the p-type impurity elements in the gate region of the p-type nitride semiconductor layer 110 may be activated.

The channel layer 130 and the barrier layer 140 are located above the n-type nitride semiconductor layer 120. The channel layer 130 and the barrier layer 140 may be made of the GaN-based materials, the channel layer 130 may contain, for example, GaN, and the barrier layer 140 may contain, for example, AlGaN.

The source 151 is located over the source region of the barrier layer 140. The gate 152 is located over the gate region of barrier layer 140. The drain 153 is located over the drain region of barrier layer 140.

In the enhancement-mode semiconductor device disclosed according to the first embodiment of this application, impurities and defects brought to the barrier layer are avoided by disposing the p-type nitride semiconductor layer 120 under the channel layer, so that a more stable and uniform threshold voltage value can be obtained. The n-type nitride semiconductor layer 110 on the first protruding structure 10 in the gate region is removed by a planarization process, so as to avoid the etching damage to the p-type nitride semiconductor layer 110 caused by the etching process, thereby avoiding affecting the performance of the channel layer.

Figure 2:
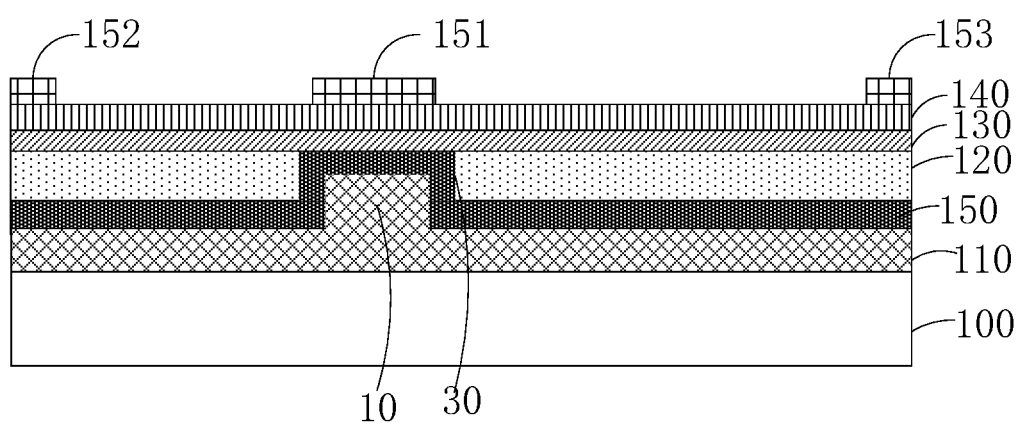
FIG. 2 is a schematic structural diagram of an enhancement-mode semiconductor device according to a second embodiment of this application.

FIG. 2 is a schematic structural diagram of an enhancement-mode semiconductor device according to a second embodiment of this application, which is substantially the same as the enhancement-mode semiconductor device of the first embodiment. The difference is that, as shown in FIG. 2, the enhancement-mode semiconductor device of the second embodiment comprises an intentionally doped nitride layer 150 located on a p-type nitride semiconductor layer 110, and the first through hole 30 penetrates a n-type nitride semiconductor layer 120 so that a gate region of the unintentionally doped nitride layer 150 is exposed.

"Unintentionally doped" means that the nitride layer 150 is not artificially doped. The unintentionally doped nitride layer 150 contains a GaN-based material, the p-type nitride semiconductor layer 110 contains p-type impurity elements with high doping concentrations, and the p-type impurity elements in the p-type nitride semiconductor layer 110 diffuse to the unintentionally doped nitride layer 150 that is immediately adjacent to it. A thickness of the unintentionally doped nitride layer 150 may be, for example, 8-20 nm, preferably 15-20 nm. In this way, it is guaranteed that a certain doping concentration is maintained at the surface of the unintentionally doped nitride layer 150 away from the p-type semiconductor layer 110, and the nitride layer 150 having an ideal doping concentration can be obtained, which prevents the p-type impurity elements from diffusing into the channel layer 130.

In the enhancement-mode semiconductor device according to the second embodiment, the unintentionally doped nitride layer 150 is activated in the gate region, which can deplete the two-dimensional electron gas at the gate region of the channel layer 130 and the barrier layer 140, thereby realizing the enhancement-mode device. Due to the existence of the n-type nitride semiconductor layer 120 and the first through hole 30, only the unintentionally doped nitride layer 150 is activated in the gate region. The process is simple, the repeatability is good, and the etching area is small, which reduces the influence of etching loss on the subsequent channel layer.

In the enhancement-mode semiconductor device disclosed in the second embodiment of this application, by presetting the highly doped p-type nitride semiconductor layer 110 under the unintentionally doped nitride layer 150, the unintentionally doped semiconductor layer 150 with an ideal doping concentration can also be obtained and the p-type impurity elements can also be prevented from diffusing into the channel layer. The p-type impurity elements, such as Mg, usually have a strong memory effect and may diffuse into the subsequently prepared semiconductor layers. Through the design of the highly doped p-type nitride semiconductor layer 110 and the unintentionally doped nitride layer 150, the diffusion of the p-type impurity elements into the channel layer 130 can be well avoided.

Figure 3:
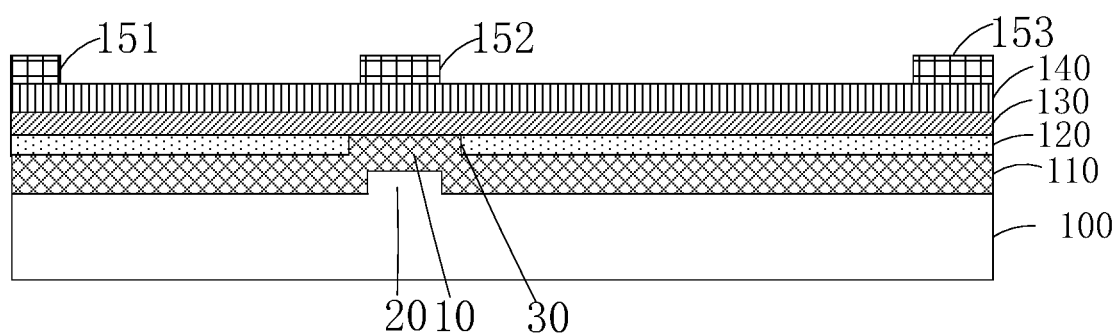
FIG. 3 is a schematic structural diagram of an enhancement-mode semiconductor device according to a third embodiment of this application.

FIG. 3 is a schematic structural diagram of an enhancement-mode semiconductor device according to a third embodiment of this application, which is substantially the same as the structure of the enhancement-mode semiconductor device according to the first embodiment and the second embodiment. The difference is that, as shown in FIG. 3, a second protruding structure 20 is disposed in a gate region on a substrate 100, a p-type nitride semiconductor layer 110 is conformally disposed on the substrate 100, and a first protruding structure 10 corresponds to the second protruding structure 20.

In the enhancement-mode device disclosed according to the third embodiment of this application, the first protruding structure 10 is obtained by disposing the second protruding structure 20 on the substrate, and gradually conducting it to the p-type nitride semiconductor layer 110. The n-type nitride semiconductor layer 110 on the first protruding structure 10 in the gate region is removed by a planarization process to avoid etching damage to the p-type nitride semiconductor layer 110 caused by the etching process, thereby avoiding affecting the performance of the channel layer.

It should also be noted that, in the description of this application, unless otherwise expressly specified and limited, the terms "disposition", "installation", "association" and "connection" should be understood in a broad sense, for example, it may be a fixed connection, it can also be a detachable connection or an integral connection; it can be a mechanical connection or an electrical connection; it can be a direct connection or an indirect connection through an intermediate medium, or the internal communication between the two components. For those of ordinary skill in the art, the specific meanings of the above terms in this application can be understood in specific situations.

It should be noted that like numerals and letters refer to like items in the following figures, so once an item is defined in one figure, it does not require further definition and explanation in subsequent figures.

In the description of this application, it should be noted that the terms "center", "upper", "lower", "left", "right", "vertical", "horizontal", "inner", "outer", etc. The indicated orientation or positional relationship is based on the orientation or positional relationship shown in the accompanying drawings, or the orientation or positional relationship that the product of the application is usually placed in use, and is only for the convenience of describing the application and simplifying the description, rather than indicating or implying the device or element referred to must have a particular orientation, be constructed and operate in a particular orientation, and therefore should not be construed as a limitation of this application. Furthermore, the terms "first", "second", "third", etc. are only used to differentiate the description and should not be construed to indicate or imply relative importance.

The above descriptions are only preferred embodiments of this application and are not intended to limit this application. For those skilled in the art, this application may have various modifications and changes. Any modification, equivalent replacement, improvement, etc. made within the spirit and principle of this application shall be included within the protection scope of this application.

What is claimed is:

1. An enhancement-mode semiconductor device, comprising:
   a substrate;
   a p-type nitride semiconductor layer located on the substrate, the p-type nitride semiconductor layer having a first protruding structure at a gate region of the p-type nitride semiconductor layer, wherein the first protruding structure does not cover a source region and a drain region of the p-type nitride semiconductor layer, and a concentration of activated p-type impurity elements located in the gate region of the p-type nitride semiconductor layer is higher than a concentration of activated p-type impurity elements in a region other than the gate region of the p-type nitride semiconductor layer;
   an n-type nitride semiconductor layer, the n-type nitride semiconductor layer being located on the p-type nitride semiconductor layer, and the n-type nitride semiconductor layer having a first through hole corresponding to the first protruding structure;
   a channel layer, the channel layer being conformally disposed on the n-type nitride semiconductor layer and the first protruding structure; and
   a barrier layer, the barrier layer being conformally disposed on the channel layer,
   wherein the enhancement-mode semiconductor device further comprises an unintentionally doped nitride layer, wherein the unintentionally doped nitride layer is located on the p-type nitride semiconductor layer, the first through hole penetrates the n-type nitride semiconductor layer so that a gate region of the unintentionally doped nitride layer is exposed; and wherein the unintentionally doped nitride layer is configured to prevent p-type impurity elements in the p-type nitride semiconductor layer from diffusing into the channel layer.

2. The enhancement-mode semiconductor device according to claim 1, further comprising:
   a source located in a source region of the barrier layer, a gate located in the gate region of the barrier layer, and a drain located in a drain region of the barrier layer.

3. The enhancement-mode semiconductor device according to claim 1, wherein an upper surface of the n-type nitride semiconductor layer and an upper surface of the first protruding structure are flush.

4. The enhancement-mode semiconductor device according to claim 1, wherein the p-type nitride semiconductor layer, the n-type nitride semiconductor layer, the channel layer and the barrier layer are made of GaN-based materials.

5. The enhancement-mode semiconductor device according to claim 1, wherein a thickness of the n-type nitride semiconductor layer is 12-20 nm.

6. The enhancement-mode semiconductor device according to claim 1, wherein a thickness of the unintentionally doped nitride layer is 15-20 nm.

7. The enhancement-mode semiconductor device according to claim 1, wherein a second protruding structure is disposed on the substrate and in the gate region, and the p-type nitride semiconductor layer is conformally disposed on the substrate, the first protruding structure corresponds to a second protruding structure.

8. The enhancement-mode semiconductor device of claim 1, wherein the substrate is a Si substrate, a sapphire substrate, a SiC substrate, or a gallium nitride substrate.

9. The enhancement-mode semiconductor device of claim 1, wherein the p-type nitride semiconductor layer contains p-type impurity elements.

10. The enhancement-mode semiconductor device of claim 9, wherein the p-type impurity elements include Mg.

11. The enhancement-mode semiconductor device of claim 9, wherein the p-type impurity elements in a region of the p-type nitride semiconductor layer corresponding to the first through hole are activated.

12. The enhancement-mode semiconductor device of claim 9, wherein the p-type impurity elements in a region of the p-type nitride semiconductor layer that is covered by the n-type nitride semiconductor layer are in a passivation state.

13. The enhancement-mode semiconductor device of claim 1, wherein the first protruding structure located at the gate region of the p-type nitride semiconductor layer is obtained by etching and removing a part of the p-type nitride semiconductor layer on a region other than the gate region.

14. The enhancement-mode semiconductor device of claim 1, wherein both the p-type nitride semiconductor layer and the unintentionally doped nitride layer contain p-type impurity elements, a doping concentration of the p-type impurity elements at a surface of the unintentionally doped nitride layer away from the p-type nitride semiconductor layer is less than a doping concentration of the p-type impurity elements in the p-type nitride semiconductor layer.

15. An enhancement-mode semiconductor device, comprising:
    a substrate;
    a p-type nitride semiconductor layer located on the substrate, the p-type nitride semiconductor layer having a first protruding structure at a gate region of the p-type nitride semiconductor layer;
    an n-type nitride semiconductor layer, the n-type nitride semiconductor layer being located on the p-type nitride semiconductor layer, and the n-type nitride semiconductor layer having a first through hole corresponding to the first protruding structure;
    a channel layer, the channel layer being conformally disposed on the n-type nitride semiconductor layer and the first protruding structure; and
    a barrier layer, the battier layer being conformally disposed on the channel layer,
    wherein a second protruding structure is disposed on the substrate and in the gate region, and the p-type nitride semiconductor layer is conformally disposed on the substrate, the first protruding structure corresponds to a second protruding structure;
    wherein the enhancement-mode semiconductor device further comprises an unintentionally doped nitride layer, wherein the unintentionally doped nitride layer is located on the p-type nitride semiconductor layer, the first through hole penetrates the n-type nitride semiconductor layer so that a gate region of the unintentionally doped nitride layer is exposed; and wherein the unintentionally doped nitride layer is configured to prevent p-type impurity elements in the p-type nitride semiconductor layer from diffusing into the channel layer.

16. An enhancement-mode semiconductor device, comprising:
    a substrate;
    a p-type nitride semiconductor layer located on the substrate, the p-type nitride semiconductor layer having a first protruding structure at a gate region of the p-type nitride semiconductor layer;

an n-type nitride semiconductor layer, the n-type nitride semiconductor layer being located on the p-type nitride semiconductor layer, and the n-type nitride semiconductor layer having a first through hole corresponding to the first protruding structure;

a channel layer, the channel layer being conformally disposed on the n-type nitride semiconductor layer and the first protruding structure; and a barrier layer, the battier layer being conformally disposed on the channel layer, wherein p-type nitride semiconductor layer contains p-type impurity elements;

wherein the p-type impurity elements in a region of the p-type nitride semiconductor layer that is covered by the n-type nitride semiconductor layer are in a passivation state;

wherein the enhancement-mode semiconductor device further comprises an unintentionally doped nitride layer, wherein the unintentionally doped nitride layer is located on the p-type nitride semiconductor layer, the first through hole penetrates the n-type nitride semiconductor layer so that a gate region of the unintentionally doped nitride layer is exposed; and wherein the unintentionally doped nitride layer is configured to prevent p-type impurity elements in the p-type nitride semiconductor layer from diffusing into the channel layer.

* * * * *